United States Patent [19]

Oritani

[11] Patent Number: 4,514,831
[45] Date of Patent: Apr. 30, 1985

[54] STATIC-TYPE SEMICONDUCTOR MEMORY DEVICE

[75] Inventor: Atsushi Oritani, Yokohama, Japan

[73] Assignee: Fujitsu Limited, Kawasaki, Japan

[21] Appl. No.: 393,119

[22] Filed: Jun. 28, 1982

[30] Foreign Application Priority Data

Jun. 30, 1981 [JP] Japan ................ 56-100526

[51] Int. Cl.$^3$ ............................................. G11C 11/40
[52] U.S. Cl. ..................................... 365/203; 365/189
[58] Field of Search ................. 365/203, 189, 230, 210

[56] References Cited

U.S. PATENT DOCUMENTS 4,099,265 7/1978 Abe ...................................... 365/190
4,368,529 1/1983 Furuama ............................. 365/203

FOREIGN PATENT DOCUMENTS 57-130285 8/1982 Japan .

Primary Examiner—Terrell W. Fears
Attorney, Agent, or Firm—Staas & Halsey

[57] ABSTRACT

A high-speed static-type semiconductor memory device having static-type memory cells each being arranged at an intersection between a word line and a bit line pair. The memory device comprises a circuit means which discharges the electric charges of all the bit lines for a predetermined time period when an input address is switched, so that the potentials of the bit lines become lower than or equal to a low potential level of a bit line signal, thereby enabling the rapid readout of data from a selected memory cell.

9 Claims, 10 Drawing Figures

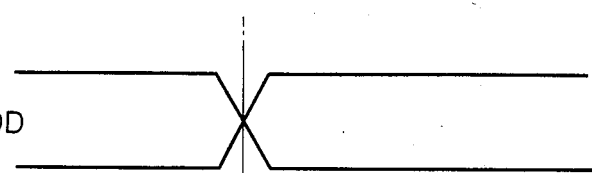
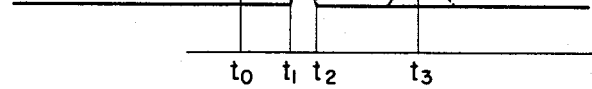

STATIC-TYPE SEMICONDUCTOR MEMORY DEVICE

BACKGROUND OF THE INVENTION (1) Field of Invention

The present invention relates to a static-type semiconductor memory device and more particularly to a MIS static-type semiconductor memory device in which the potentials of all the bit lines are forced to be lower than or equal to a low-level of a logic signal of the bit lines, thereby enabling a high-speed readout operation to be carried out.

(2) Description of the Prior Art

In recent years, the memory capacity of a semiconductor memory device has become very large, and, according to the increase in the memory capacity, the size of the memory cells and/or peripheral circuit elements has become very small. Therefore, the drive capacity of each memory cell and the gm (transconductance) of each of the load transistors connected between the bit lines and a power source are relatively small. Since the stray capacitance of each bit line becomes relatively large in accordance with the increase in the memory capacity, both the rise time and the fall time of a bit line potential becomes relatively long, thereby deteriorating the readout speed.

A static-type semiconductor memory device disclosed in Japanese Patent Application No. 56-13940 (corresponding to Unexamined Patent Publication No. 57-130285 (Kokai)) filed by the present applicant, where a memory device comprises a circuit for disconnecting all the memory cells from the bit lines when an address signal is changed and a circuit for rapidly precharging all the bit lines to a high-potential level. The readout speed of this static-type semiconductor memory device is greatly increased due to its structure.

However, in the memory device disclosed in the above-mentioned application, it is difficult to rapidly pull up the potentials of the bit lines because the gm of the charging transistors becomes small in accordance with the rise of the potentials of the bit lines. Moreover, since the speed of discharging the bit lines toward a low-potential level cannot be very fast, the device can be improved by further increasing the readout speed.

SUMMARY OF THE INVENTION

It is, therefore, an object of the present invention to increase the readout speed of a static-type semiconductor memory device.

According to the present invention, there is provided a static-type semiconductor memory device having static-type memory cells, each being arranged at an intersection of a word line and a bit line pair, characterized in that the memory device comprises a circuit means which discharges the electric charges of all the bit lines of the bit line pairs for a predetermined time period so that the potentials of the bit lines become lower than or equal to a low potential level of a logic signal of the bit lines when an input address signal has changed.

BRIEF DESCRIPTION OF THE DRAWINGS

FIGS. 2A through 2E are waveform diagrams of the memory device of FIG. 1;

DESCRIPTION OF THE PREFERRED EMBODIMENT

An embodiment of the present invention will now be explained with reference to the attached drawings.

Figure 1:
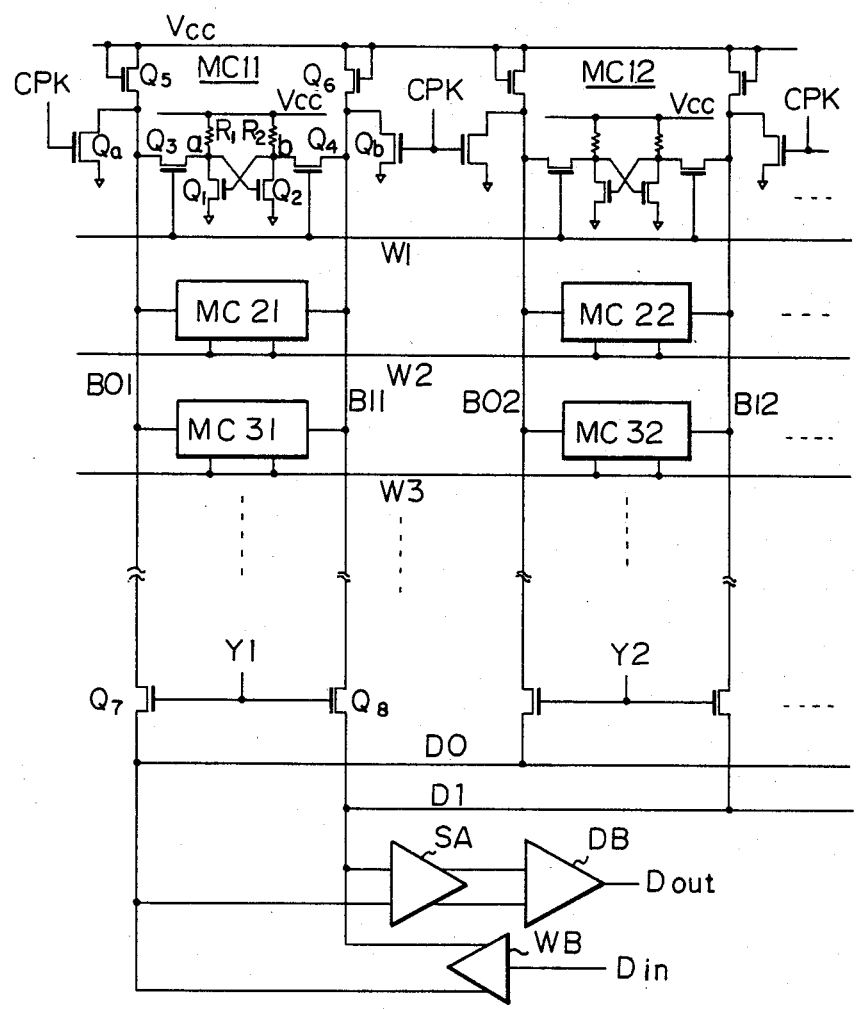
FIG. 1 is a block circuit diagram of a MIS static-type semiconductor memory device as an embodiment of the present invention.

FIG. 1 illustrates an essential part of a metal-insulator semiconductor (MIS) static-type random access memory (RAM) device as an embodiment of the present invention. The MIS static-type RAM device of FIG. 1 comprises a plurality of flip-flop-type memory cells MCij (i=1, 2, ...; j=1, 2, ...) arranged at intersections between the word lines W1, W2, ... and the bit line pairs B01, B11; B02, B12; .... Each of the memory cells, for example, MC11, comprises a flip-flop circuit formed by MIS transistors Q1 and Q2 and load resistors R1 and R2 and transfer gates formed by MIS transistors Q3 and Q4. One end of each of the bit lines B01, B11, B02, B12, ... is connected to a power source $V_{cc}$ by a bit line load transistor. For example, the ends of the bit lines B01 and B11 are connected to the power source $V_{cc}$ by the bit line load transistors Q5 and Q6, respectively. The other ends of the bit lines B01 and B11 are, respectively, connected to data buses D0 and D1 constituting a data bus pair by column-selecting transistors Q7 and Q8. The data bus pair D0, D1 is connected to a sense amplifier SA and a write-in buffer WB. The outputs of the sense amplifier SA are output from a data output buffer DB as data output $D_{out}$.

In the RAM of FIG. 1, when the potential of a word line, for example, W1, is rendered high, the transistors Q3 and Q4 are turned on and the memory cell MC11 is connected to the bit line pair B01, B11. In this condition, when a column-selecting signal Y1 is rendered high, the transistors Q7 and Q8 are turned on and the bit lines B01 and B11 are connected to the data buses D0 and D1, respectively. Thus, the memory cell MC11 arranged at the intersection between the word line W1 and the bit line pair B01, B11 is selected.

In this condition, if write-in data $D_{in}$ is supplied to the write-in buffer and the potentials of the bit lines B01 and B11 are rendered, for example, high and low, respectively, by the data buses D0 and D1, the transistor Q1 of the memory cell MC11 is turned off and the transistor Q2 thereof is turned on, and the write-in of data into the selected memory cell MC11 is effected.

In order to read out data from the selected memory cell, for example, MC11, the potential of the word line W1 and the column-selecting signal Y1 are rendered high and the sense amplifier SA is activated. If the transistors Q1 and Q2 of the memory cell transistor MC11 are turned off and on, respectively, the potentials of point a and point b of the memory cell MC11 are high and low, respectively. The high-potential level of point a and the low potential level of point b are transferred to the bit lines B01 and B11, respectively, through the turned-on transistors Q3 and Q4, and the potentials of the bit lines B01 and B11 are transferred to the data buses D0 and D1 and to the sense amplifier SA through the turned-on transistors Q7 and Q8. Thus, the reading out of data from the selected memory cell MC11 is performed.

In the memory device of FIG. 1, the potential of the bit line B01 is determined by the gm ratio of the transistors Q1, Q3, and Q5, and the potential of the bit line B11 is determined by the gm ratio of the transistors Q2, Q4, and Q6. Since the memory capacity of recent memory devices has become larger and larger, the sizes of the memory cells and peripheral circuits have necessarily become very small. Therefore, if the size of each memory cell of the memory device of FIG. 1 is very small, the transistors Q1 and Q2 must be very small and, as a result, the gm of these transistors Q1 and Q2 is small. In this case, it is necessary to decrease the gm of the bit line load transistors Q5 and Q6 in order to obtain a sufficiently large-signal amplitude on each of the bit lines, i.e., in order to obtain a sufficiently high high-level signal and a sufficiently low low-level signal. However, if the gm of the transistors Q5 and Q6 is small, the rise time of the potential of each bit line becomes long and, therefore, the speed of the readout operation becomes slow.

With regard to such a problem, the present invention uses MIS transistors $Q_a$ and $Q_b$ for discharging the electric charges on the bit lines B01 and B11. The drains of the transistors $Q_a$ and $Q_b$ are connected to the bit lines B01 and B11, respectively, and the sources thereof are connected to, for example, ground. The gates of these transistors $Q_a$ and $Q_b$ are supplied with a clock pulse CPK, having a narrow width, which is generated when an input address to the memory device changes.

Operation of these transistors $Q_a$ and $Q_b$ will be explained in detail with reference to FIGS. 2A through 2E. As illustrated in FIG. 2A, when at least one bit of an input address ADD is switched between a high-potential level and a low-potential level at a time $t_0$, a clock pulse CPK having a narrow pulse width $t_1-t_0$ is generated from a clock pulse generator, which will be explained later, as illustrated in FIG. 2B. The clock pulse CPK is applied to the gates of the transistors $Q_a$ and $Q_b$ for discharging bit line charges. Assuming that, before the time $t_0$, a word line $W_x$ from the word lines W2, W3, ... is selected and the potential of one of the output terminals on the side of the bit line B01 of the memory cell connected to the selected word line $W_x$ is high and the potential of another of the output terminals on the side of the bit line B11 is low, the potential of the bit line B01 is high and the potential of the bit line B11 is low at the time before the time $t_0$, as illustrated in FIG. 2C. The low-potential level of each bit line is higher than ground potential due to the potential drop of the transistors of the flip-flop circuit and the transistors of the transfer gate of the memory cell, i.e., the transistors Q1 and Q3 or Q2 and Q4 in the case of the memory cell MC11. When the clock pulse CPK is applied to the gates of the transistors $Q_a$ and $Q_b$, i.e., during the time period between $t_0$ and $t_1$, the electric charges of the bit lines B01 and B11 are discharged to ground by the transistors $Q_a$ and $Q_b$, respectively. Since the discharging speed of the bit line B01 having a high-potential level is faster than that of the bit line B11 having a low-potential level, the potential of the bit line B01 and that of the bit line B11 both fall to a medium potential level ML which is between the ground potential and the low-potential level and which is determined by the gm ratio between the bit line load transistors Q5 or Q6 and the transistors $Q_a$ or $Q_b$.

Assuming that the input address has changed and the word line W1 is selected just after any one of the word lines $W_x$ was selected, the potential of the word line $W_x$ falls rapidly and the potential of the word line W1 rises more slowly than the fall of the potential of the word line $W_x$. This is because it takes a longer time to charge up the word line than to discharge it. When the potential of the word line W1 starts to rise, the transistors Q3 and Q4 of the memory cell MC11 start to turn on. In this case, if the potential of node a of the memory cell MC11 is low and if the potential of node b thereof is high, the potential of the bit line B11 rises rapidly toward a high level and the potential of the bit line B01 rises slowly toward a low level, as illustrated in FIG. 2C. At the time $t_2$ when the potential of the word line W1 substantially has risen to a high level, the potential difference between the bit lines B01 and B11 is high, as illustrated in FIG. 2C. The sense amplifier SA immediately detects this potential difference and outputs a data output $D_{out}$ through the data output buffer DB, as illustrated in FIG. 2E. Therefore, the readout time of the memory device of the present embodiment is $t_2-t_0$.

In a conventional memory device which does not comprise transistors for discharging the electric charges of the bit lines, such as the transistors $Q_a$ and $Q_b$ of FIG. 1, the potential of the bit line rises or falls very slowly, as illustrated by the dotted lines of FIG. 2C, after the input address has changed. This is because, as mentioned above, the gm of the transistors of the memory cell and the bit line load transistors is small in a recent conventional memory device having a large memory capacity. Therefore, in this memory device, the switching time of the bit line potentials is $t_3$, and the readout time of the conventional memory device is larger than $t_3-t_0$.

A practical experiment has shown that in the conventional RAM device which does not comprise transistors for discharging the electric charges of the bit lines, the readout time $t_3-t_0$ was approximately 35 nano-seconds while the readout time $t_2-t_0$ of the RAM device according to the present invention shown in FIG. 1 was approximately 25 or 26 nano-seconds. Therefore, according to the present invention, the readout time can be reduced by approximately 10 nano-seconds, and therefore the present invention is very advantageous for use in a high-speed static RAM device.

In the aforementioned static-type semiconductor memory device disclosed in Japanese Patent Application No. 56-13940, pull-up transistors for precharging bit lines to a high-potential level when an input address is switched, are used instead of the transistors used in the embodiment of FIG. 1 for discharging the electric charges of the bit lines. However, in general, a discharge operation by a MIS transistor is effected more rapidly than a charge-up operation by a MIS transistor. Therefore, the readout time of the memory device according to the present invention which uses transistors for discharging the electric charges of the bit lines, can be smaller than that of the memory device which uses pull-up transistors. Moreover, since the gm of each of the transistors for discharging the electric charges of the bit lines can be smaller than the gm of each of the pull-up transistors, the load of a circuit for supplying the clock pulse CPK can be lighter and the power consumption can be smaller in the memory device according to the present invention than in the memory device which uses pull-up transistors.

Figure 3A:
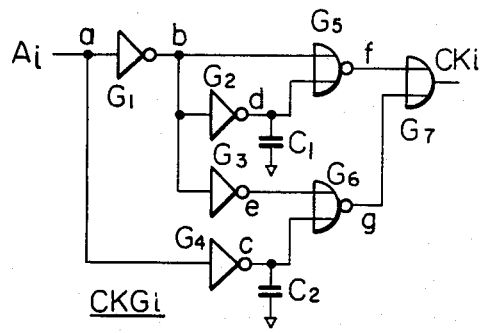
FIGS. 3A and 3B are block circuit diagrams of a clock pulse generator circuit used in the memory device of FIG. 1.
Figure 3B:
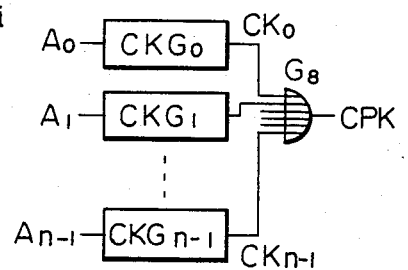

FIGS. 3A and 3B are circuit diagrams of a clock pulse generator circuit for generating the clock pulse CPK. In FIG. 3A, G1 through G4 are inverters, G5 and G6 are NOR gates, and G7 is an OR gate. These inverters and gates G1 through G7 are connected in the manner illustrated in FIG. 3A and constitute a clock generator unit $CKGi$ ($i=0,\ldots,n-1$). C1 and C2 are capacitors connected between the output of the inverter G2 and ground and between the output of the inverter G4 and ground. The clock generator unit $CKGi$ receives one bit $A_i$ from an input address signal having one or more bits A0 through $A_{n-1}$ and outputs a clock signal $CKi$. The clock generator unit $CKGi$ of FIG. 3A is provided for each bit of the input address signal. The output clock signal CK0, CK1, ..., $CK_{n-1}$ from the clock generator units CKG0, CKG1, ..., $CKG_{n-1}$ are coupled with an OR gate G8 so as to generate the clock pulse CPK, as illustrated in FIG. 3B.

Figure 4:
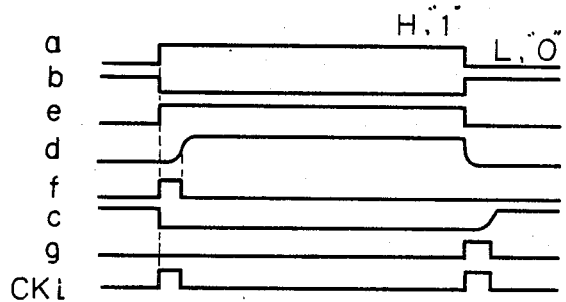
FIG. 4 is a waveform diagram of the clock pulse generator circuit of FIGS. 3A and 3B.

Operation of the clock pulse generator circuit of FIGS. 3A and 3B will be explained with reference to FIG. 4. In the clock generator unit of FIG. 3A, when an input address bit $A_i$ of node a changes from high (H), i.e., "1", to low (L), i.e., "0", and vice versa, the output signal of the inverter G1 at node b changes from low to high and vice versa, as illustrated in FIG. 4(b). Due to the capacitor C1, the inverter G2 outputs a signal at node d which is slightly delayed at each rising edge thereof. Therefore, the NOR gate G5 outputs a pulse signal which is generated at each rising edge of the address bit $A_i$, as illustrated in FIG. 4(f). Another circuit constituting of the inverters G3 and G4, the capacitor C2, and the NOR gate G6 operates in a similar manner but outputs a pulse signal which is generated at each falling edge of the address bit $A_i$, as illustrated in FIG. 4(g). Therefore, the OR gate G7 outputs the clock signal $CKi$ which is generated at every transient time of the address bit $A_i$, and, as a result, the OR gate G8 of the circuit of FIG. 3B outputs the clock pulse CPK, which is generated when at least one of the address bits A0 through $A_{n-1}$ has changed.

Figure 5:
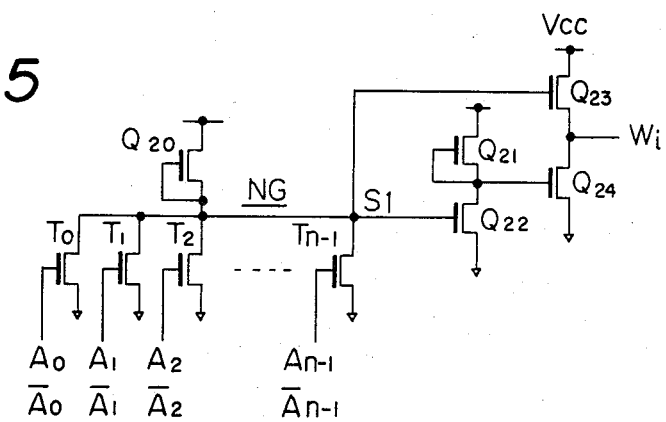
FIG. 5 is a circuit diagram of a word address decoder used in the memory device of FIG. 1.

FIG. 5 is a circuit diagram of a word decoder for one word line used in the memory device of FIG. 1. In FIG. 5, NG is a NOR gate comprising transistors T0 through $T_{n-1}$ to which the address signal bits A0 or $\overline{A0}$, A1 or $\overline{A1}$, ..., $A_{n-1}$ or $\overline{A_{n-1}}$ are input, respectively, and a common load transistor Q20. The NOR gate NG generates an output signal S1 which becomes high when all the input address signal bits are low. The output signal S1 is supplied to the gate of a MIS transistor Q23 which constitutes, together with a MIS transistor Q24, a word address driver, and to the gate of the MIS transistor Q24 through an inverter constituted of MIS transistors Q21 and Q22. When the signal S1 is high, the word address driver renders the potential of the word line $W_i$ high. The word address driver is operated by the same power source $V_{cc}$ as that of the memory circuit of FIG. 1.

According to the present invention, in a static-type memory device which has a high degree of integration and which uses transistors each having a small drive capacity, the potentials of all the bit lines are pulled down to a medium level between a low potential level and ground level when an input address signal is switched. Thereafter, the potential of one of the selected bit lines is pulled up toward a high level and the potential of the other bit line is pulled up toward a low level. Thereby, a high readout speed is obtained.

I claim:

1. A static-type semiconductor memory device operatively connected to receive an input address signal comprising:
    a plurality of word lines;
    a plurality of bit line pairs intersecting said plurality of word lines;
    a plurality of static-type memory cells, respectively, operatively connected at intersections of said plurality of word lines and said plurality of bit line pairs, each of said bit line pairs respectively developing high and low potential levels corresponding to readout data from said static-type memory cells; and
    circuit means, operatively connected to said bit line pairs, for discharging the electric charges of said bit line pairs for a predetermined time period, said circuit means comprising means for lowering the potential levels of said bit line pairs to a level lower than said low potential level in response to a change in the input address signal.

2. A memory device according to claim 1, wherein said circuit means comprises a clock pulse generator circuit which generates a clock pulse when at least one bit of the input address signal is changed, and wherein said predetermined time period is determined by the pulse width of said clock pulse.

3. A memory device according to claim 2, wherein said clock pulse generator circuit comprises:
    one or more clock pulse generator units, each of which is operatively connected to receive one bit of the input address signal, for detecting the change of said one bit of the input address signal and for generating an output signal; and
    an OR gate, operatively connected to said clock pulse generator units, for receiving the output signal from said clock pulse generator units and for generating said clock pulse.

4. A memory device according to claim 1, 2 or 3, wherein said means for lowering, included in said circuit means, comprises a plurality of MIS transistors, each having a gate and each operatively connected between a respective one of said bit line pairs and a voltage source, the voltage source providing a potential lower than said low potential level of said respective one of said bit line pairs.

5. A memory device according to claim 4, wherein said voltage source is ground.

6. A memory device according to claim 4, wherein said clock pulse is supplied to said respective gates of said MIS transistors.

7. A memory device according to claim 1, further comprising a bit line load transistor having a resistance and operatively connected between a respective one of said bit line pairs and a power supply, wherein each of said static-type memory cells further comprises a flip-flop circuit having a plurality of MIS transistors having on-resistances, two of said plurality of MIS transistors forming a transfer gate and wherein said low potential level of a respective one of said bit line pairs is determined by the ratio of the sum of the on-resistances of said MIS transistors of said transfer gate and the resistance of said bit line load transistor.

8. A memory device according to claim 7, wherein said low potential level of said respective one of said bit line pairs is equal to the power supply voltage divided by said ratio.

9. A static-type semiconductor memory device operatively connected to receive an input address signal, comprising:

M word lines, M being an integer greater than one;

N bit lines, N being an integer greater than one, pairs of said N bit lines, respectively, operatively connected to said M word lines, each of said N bit lines having a low potential level or a high potential level;

M×N static-type memory cells, respectively, operatively connected between intersections of said M word lines and said pairs of said N bit lines; and circuit means, operatively connected to said M word lines and said N bit lines, for discharging the electric charges of said N bit lines for a predetermined time period, said circuit means comprising means for lowering the potential levels of said N bit lines to a level lower than the low potential level of said N bit lines when the input address signal changes.

* * * * *